United States Patent
Kim et al.

(10) Patent No.: US 10,566,561 B2
(45) Date of Patent: Feb. 18, 2020

(54) ORGANIC LIGHT EMITTING DIODE AND ORGANIC LIGHT EMITTING DISPLAY DEVICE INCLUDING THE SAME

(71) Applicant: LG Display Co., Ltd., Seoul (KR)

(72) Inventors: Jun-Yun Kim, Goyang-si (KR); Joong-Hwan Yang, Gwangmyeong-si (KR); Hyo-Jin Noh, Paju-si (KR); Dae-Wi Yoon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 197 days.

(21) Appl. No.: 15/718,204

(22) Filed: Sep. 28, 2017

(65) Prior Publication Data

US 2018/0090705 A1   Mar. 29, 2018

(30) Foreign Application Priority Data

Sep. 29, 2016 (KR) .......................... 10-2016-0125727

(51) Int. Cl.
*H01L 51/50* (2006.01)
*H01L 51/00* (2006.01)

(52) U.S. Cl.
CPC ...... *H01L 51/5012* (2013.01); *H01L 51/0072* (2013.01); *H01L 51/5004* (2013.01)

(58) Field of Classification Search
CPC ............ H01L 51/5012; H01L 51/5028; H01L 51/5004; H01L 51/0072; H01L 2251/552; H01L 51/5036; H01L 51/0067; H01L 27/3244

See application file for complete search history.

(56) References Cited

U.S. PATENT DOCUMENTS

| | | | |
|---|---|---|---|
| 2006/0279204 A1 | 12/2006 | Forrest et al. | |
| 2008/0203905 A1* | 8/2008 | Je | C09K 11/06 313/504 |
| 2016/0301014 A1* | 10/2016 | Kawamura | H01L 51/0094 |
| 2017/0018720 A1* | 1/2017 | Adachi | C07D 403/12 |

(Continued)

FOREIGN PATENT DOCUMENTS

| | | |
|---|---|---|
| CN | 101156257 A | 4/2008 |
| CN | 105556696 A | 5/2016 |

(Continued)

OTHER PUBLICATIONS

First Notification of Office Action dated Dec. 28, 2018, issued in corresponding Chinese Patent Application No. 201710899258.3.

(Continued)

*Primary Examiner* — Alexander C Kollias
(74) *Attorney, Agent, or Firm* — Morgan, Lewis & Bockius LLP

(57) ABSTRACT

An organic light emitting diode includes an emitting material layer including first and second layers; a first electrode on a side of the emitting material layer; and a second electrode on the other side of the light emitting material layer and facing the first electrode, wherein the first layer includes a first compound, and the second layer includes a second compound, wherein the first compound has a difference, between a singlet energy and a triplet energy, less than 0.3 eV, and wherein the singlet energy of the first compound is greater than a singlet energy of the second compound.

10 Claims, 7 Drawing Sheets

(56) References Cited

U.S. PATENT DOCUMENTS

2017/0256733 A1    9/2017   Tsukamoto et al.

FOREIGN PATENT DOCUMENTS

| WO | 2016/017688 A1 | 2/2016 |
| WO | 2016/027760 A1 | 2/2016 |

OTHER PUBLICATIONS

Extended European Search Report dated Jan. 31, 2018, issued in corresponding European Patent Application No. 17194157.8.
Uoyama et al., "Highly efficient organic light-emitting diodes from delayed fluorescence", Nature, vol. 492, pp. 234-240, Dec. 13, 2012.

* cited by examiner

ORGANIC LIGHT EMITTING DIODE AND ORGANIC LIGHT EMITTING DISPLAY DEVICE INCLUDING THE SAME

CROSS REFERENCE TO RELATED APPLICATIONS

The present application claims the priority benefit of Korean Patent Application No. 10-2016-0125727 filed in Republic of Korea on Sep. 29, 2016, which is hereby incorporated by reference in its entirety for all purposes as if fully set forth herein.

BACKGROUND

Technical Field

The present invention relates to an organic light emitting diode, and more particularly, to an organic light emitting diode having a high quantum efficiency (light emission efficiency) and a narrow full width at half maximum, and an organic light emitting display device including the same.

Discussion of the Related Art

Recently, as display devices become large in size, a demand for flat display elements occupying a small space increases, and a technology of an organic light emitting display device including an organic light emitting diode (OLED) as one out of the flat display elements has been developed rapidly.

The OLED is an element where when an electrode and a hole are injected to an emitting material layer formed between an electron injection electrode (cathode) and a hole injection electrode (anode), an electrode-hole pair is generated then disappears to emit a light.

The OLED is able to be formed on a flexible transparent substrate such as a plastic, is able to be operated at a low voltage (e.g., below 10V), is relatively low in a power consumption, and is excellent in colors.

The OLED includes a first electrode on a substrate, a second electrode facing and spaced apart from the first electrode, and an organic light emitting layer between the first and second electrodes. For example, the first electrode may be an anode, and the second electrode may be a cathode.

To improve a light emission efficiency, the organic light emitting layer may include a hole injection layer (HIL), a hole transporting layer (HTL), an emitting material layer (EML), an electron transporting layer (ETL) and an electron injection layer (ETL) that are sequentially stacked on the first electrode.

A hole moves from the first electrode as an anode to the emitting material layer through the hole injection layer and the hole transporting layer, and an electrode moves from the second electrode as a cathode to the emitting material layer through the electron injection layer and the electron transporting layer.

The hole and electron moving to the emitting material layer are combined and form an exciton, which is excited to an unstable energy state and then returns to a stable energy state to emit a light.

An emitting material used for the emitting material layer may be broadly categorized into a fluorescent material and a phosphorescent material.

When the exciton is formed by combining the hole and the electron, a singlet exciton and a triplet exciton are formed at a ratio of 1:3. In case of the phosphorescent material, both of the singlet exciton and the triplet exciton are involved in light emission, and thus the OLED including the emitting material layer of the phosphorescent material has a high light emission efficiency.

However, the phosphorescent emission has limits to an iridium (Ir) complex design, which should use an Ir complex, and to a blue emission.

The fluorescent material has a less limit to a dopant and is applicable to a blue emission. However, in the fluorescent material, only a singlet exciton is involved to a light emission while the triplet exciton of the remaining 75% is not involved to a light emission. Accordingly, the OLED including the emitting material layer of the fluorescent material has a low quantum efficiency.

SUMMARY

Accordingly, the present invention is directed to an organic light emitting diode and an organic light emitting display device including the same that substantially obviates one or more of the problems due to limitations and disadvantages of the related art.

An object of the present invention is to provide an organic light emitting diode and an organic light emitting display device including the same that can improve a low quantum efficiency of an organic light emitting diode using a fluorescent material.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an organic light emitting diode includes an emitting material layer including first and second layers; a first electrode on a side of the emitting material layer; and a second electrode on the other side of the light emitting material layer and facing the first electrode, wherein the first layer includes a first compound, and the second layer includes a second compound, wherein the first compound has a difference, between a singlet energy and a triplet energy, less than 0.3 eV, and wherein the singlet energy of the first compound is greater than a singlet energy of the second compound.

In another aspect, an organic light emitting display device includes a substrate; a thin film transistor on the substrate; and the above-described organic light emitting diode connected to the thin film transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to exemplary embodiments, examples of which are illustrated in the accompanying drawings. The same reference numbers may be used throughout the drawings to refer to the same or like parts.

Figure 1:
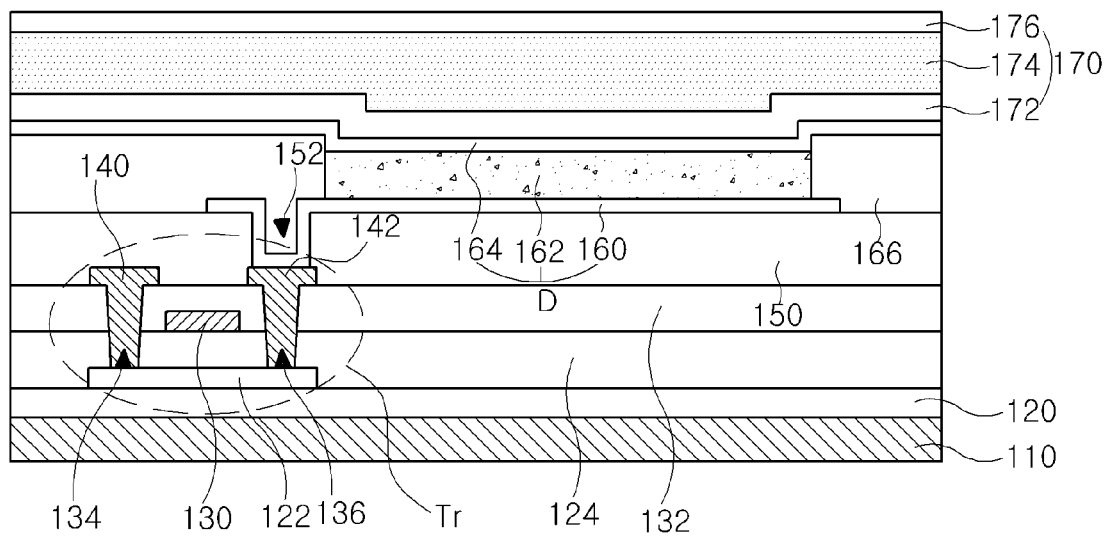
FIG. 1 is a schematic cross-sectional view illustrating an organic light emitting display device according to the present invention.

FIG. 1 is a schematic cross-sectional view illustrating an organic light emitting display device according to the present invention.

Referring to FIG. 1, the organic light emitting display device 100 includes a thin film transistor Tr located on a substrate 110, and an organic light emitting diode D connected to the thin film transistor Tr.

The substrate 110 may be a glass substrate or plastic substrate. For example, the substrate 110 may be made of polyimide.

A buffer layer 120 is formed on the substrate 110, and the thin film transistor Tr is formed on the buffer layer 120. The buffer layer 120 may be omitted.

A semiconductor layer 122 is formed on the buffer layer 120. The semiconductor layer 122 may be made of an oxide semiconductor material or polysilicon.

When the semiconductor layer 122 is made of an oxide semiconductor material, a light shielding pattern may be formed below the semiconductor layer 122, and the light shielding pattern functions to prevent a light from entering the semiconductor layer 122 and prevents a deterioration of the semiconductor layer 122 by a light. When the semiconductor layer 122 is made of polysilicon, both sides of the semiconductor layer 122 may be doped with impurities.

A gate insulating layer 124 is formed on the semiconductor layer 122 and is made of an insulating material. The gate insulating layer 124 may be made of an inorganic insulating material such as silicon oxide or silicon nitride.

A gate electrode 130 is formed on the gate insulating layer 124 corresponding to a center portion of the semiconductor layer 122 and is made of a conductive material such as a metal.

In FIG. 1, the gate insulating layer 124 is formed entirely over the substrate 110 by way of example. Alternatively, the gate insulating layer 124 may be patterned to have the same shape as the gate electrode 130.

An inter-layered insulating layer 132 is formed on the gate electrode 130 and is made of an insulating material. The inter-layered insulating layer 132 may be made of an inorganic insulating material such as silicon oxide or silicon nitride, or an organic insulating material such as benzocyclobutene or photo acryl.

The inter-layered insulating layer 132 has first and second contact holes 134 and 136 exposing both sides of the semiconductor layer 122. The first and second contact holes 134 and 136 are located at both sides of the gate electrode 130 and are spaced apart from the gate electrode 130.

The first and second contact holes 134 and 136 are formed in the gate insulating layer 124. Alternatively, when the gate insulating layer 124 is formed to have the same shape as the gate electrode 130, the first and second contact holes 134 and 136 may be formed only in the inter-layered insulating layer 132.

Source and drain electrodes 140 and 142 are formed on the inter-layered insulating layer 132 and are made of a conductive material such as metal.

The source and drain electrodes 140 and 142 are spaced apart from each other with the gate electrode 130 therebetween, and contact the both sides of the semiconductor layer 122 through the first and second contact holes 134 and 136, respectively.

The semiconductor layer 122, the gate electrode 130, and the source and drain electrodes 140 and 142 form the thin film transistor Tr, which functions as the driving element Tr.

The thin film transistor Tr has a coplanar structure that the gate electrode 130 and the source and drain electrodes 140 and 142 are located on the semiconductor layer 122.

Alternatively, the thin film transistor Tr may have an inverted staggered structure that a gate electrode is located below a semiconductor layer, and source and drain electrodes are located on the semiconductor layer. In this case, the semiconductor layer may be made of amorphous silicon.

Even though not shown in the drawings, a gate line and a data line cross each other to define a pixel region, and a switching element connected to the gate and data lines is further formed. The switching element is connected to the thin film transistor Tr of the driving element.

Further, a power line may be formed parallel with, and is spaced apart from, the gate or data line, and a storage capacitor may be formed that functions to maintain a voltage of the gate electrode 130 of the thin film transistor Tr as the driving element during one frame.

A passivation layer 150 is formed to cover the thin film transistor Tr, and has a drain contact hole 152 exposing the drain electrode 142.

A first electrode 160 is formed separately at each pixel region and is connected to the drain electrode 142 of the thin film transistor Tr through the drain contact hole 152. The first electrode 160 may be an anode, and may be made of a conductive material having a relatively high work function. For example, the first electrode 160 may be made of a transparent conductive material such as indium-tin-oxide (ITO) or indium-zinc-oxide (IZO).

When the organic light emitting display device 100 is a top emission type display device, a reflection electrode or reflection layer may be further formed below the first electrode 160. For example, the reflection electrode or reflection layer may be made of aluminum-paladium-copper (APC) alloy.

A bank layer 166 is formed on the passivation layer 150 and covers edges of the first electrode 160. The bank layer 166 corresponds to the pixel region and exposes a center portion of the first electrode 160.

An organic emitting layer 162 is formed on the first electrode 160. The organic emitting layer 162 may have a single-layered structure that includes an emitting material layer made of an emitting material. Alternatively. to raise a light emission efficiency, the organic emitting layer may have a multi-layered structure that includes a hole injection layer, a hole transporting layer, the emitting material layer, an electron transporting layer and an electron injection layer which are stacked sequentially on the first electrode 160.

A second electrode 164 is formed on the substrate 110 having the organic emitting layer 162. The second electrode 164 may be located entirely over a display region, and may be made of a conductive material having a relatively low work function and function as a cathode. For example, the second electrode 164 may be made of one of aluminum (Al), magnesium (Mg), and aluminum-magnesium (AlMg) alloy.

The first electrode 160, the organic emitting layer 162 and the second electrode 164 form the organic light emitting diode D.

An encapsulation film 170 is formed on the second electrode 164 in order to prevent an external moisture from penetrating into the organic light emitting diode D. The encapsulation film 170 may have, but not limited to, a structure that a first inorganic insulating layer 172, an organic insulating layer 174 and a second inorganic insulating layer 176 are stacked.

A polarizing plate may be attached on the encapsulation film 170 in order to reduce a reflection of an external light. For example, the polarizing plate may be a circular polarizing plate.

Figure 2:
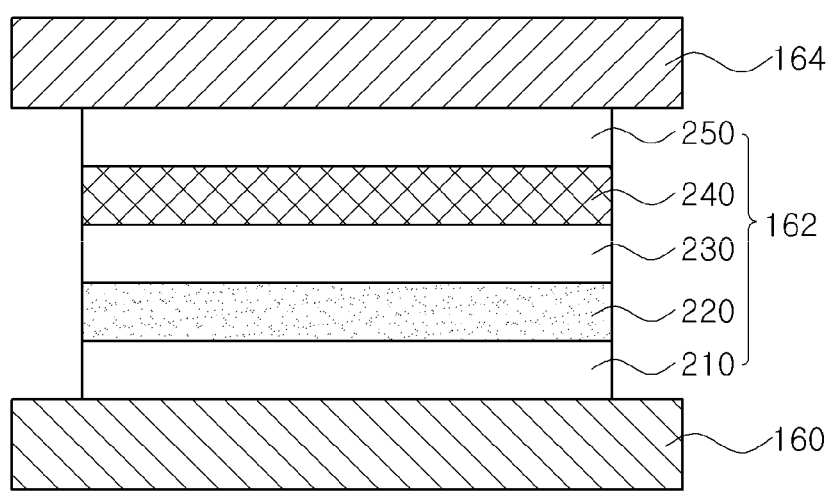
FIG. 2 is a schematic cross-sectional view illustrating an organic light emitting diode according to a first embodiment of the present invention.

FIG. 2 is a schematic cross-sectional view illustrating an organic light emitting diode according to a first embodiment of the present invention.

Referring to FIG. 2, the organic light emitting diode D of this embodiment includes first and second electrodes 160 and 164 facing each other, and an organic emitting layer 162 between the first and second electrodes 160 and 164. An emitting material layer 230 of the organic emitting layer 162 includes a delayed fluorescent compound.

The delayed fluorescent compound is configured such that a triplet exciton is activated by an electric field and is thus up-converted into a singlet exciton, and accordingly, both of the triplet exciton and the singlet exciton are involved in light emission. Therefore, a quantum efficiency of the organic light emitting diode D increases.

Figure 3:
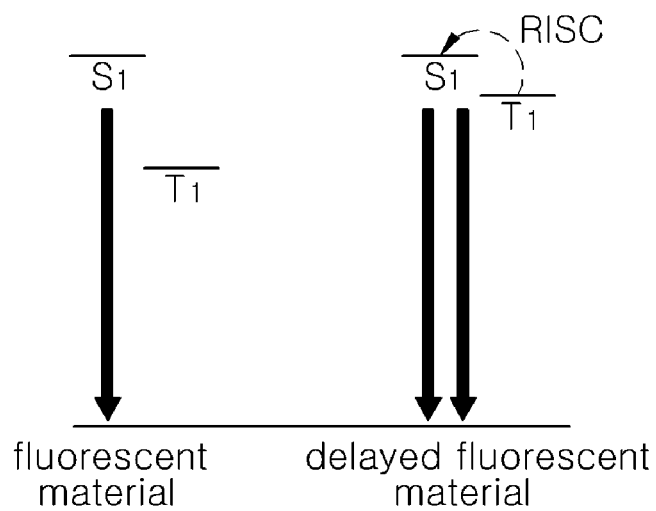
FIG. 3 is a view explaining a light emission mechanism in an organic light emitting diode.

Referring to FIG. 3 that is a view explaining a light emission mechanism in an organic light emitting diode, in case of a fluorescent material, since a light emission does not happen by a triplet energy T1 but happens by a singlet energy S1, a quantum efficiency of an organic light emitting diode using a fluorescent material is low.

However, in case of the delayed fluorescent material, since a triplet energy T1 is converted (or transited) to a singlet energy S1 and a light emission thus happens, a quantum efficiency of the organic light emitting diode D using the delayed fluorescent material rises.

In this case, the delayed fluorescent material preferably has an energy difference $\Delta E_{ST}$, between the triplet energy and the singlet energy, less than 0.3 eV, and accordingly, an effect of a reverse intersystem crossing (RISC), that is a process of a transfer from the triplet energy T1 to the singlet energy S1, can be achieved.

The fluorescent material and the delayed fluorescent material can be distinguished from each other by an apparatus (e.g., Quantaurus-Tau) measuring a lifetime of a luminous body.

Figure 4:
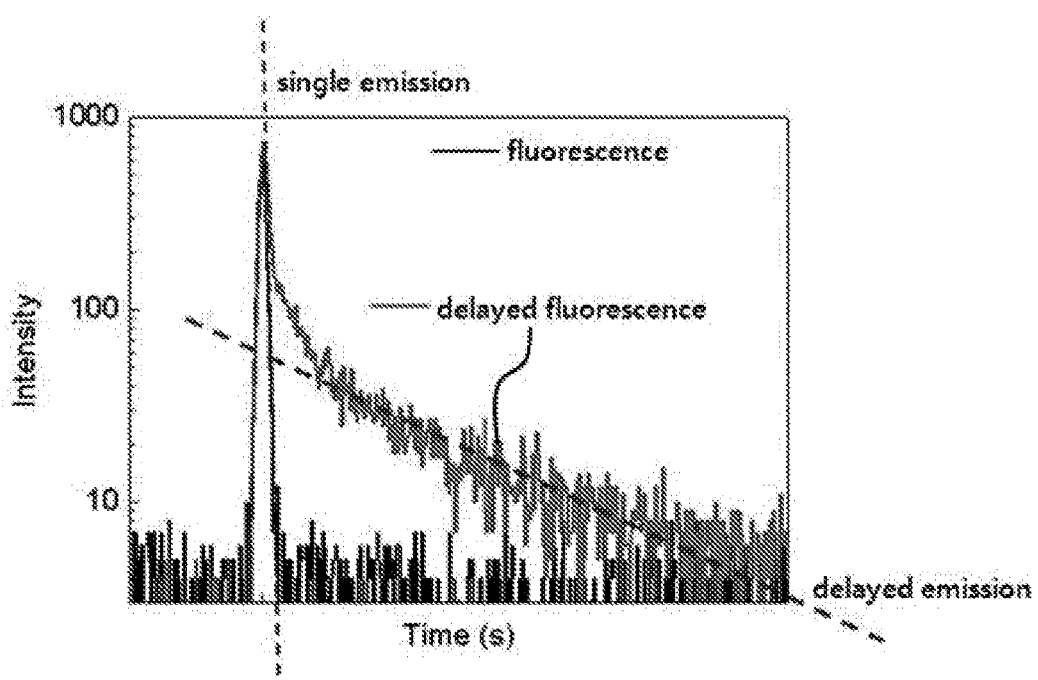
FIG. 4 is a graph illustrating luminous properties of a fluorescent material and a delayed fluorescent material.

When measuring lifetimes of luminous bodies, as shown in FIG. 4 that is a graph illustrating luminous properties of a fluorescent material and a delayed fluorescent material, a single emission is observed from the fluorescent material while a single emission then a delayed emission are observed from the delayed fluorescent material.

This difference is caused by a light emission mechanism. In the case of the delayed fluorescent material, a time difference of an up-conversion from the triplet energy into the singlet energy happens, and thus the delayed emission is observed.

Referring to FIG. 2, the organic emitting layer 162 of the organic light emitting diode D may further include a hole injection layer 210 between the first electrode 160 and the emitting material 230, a hole transporting layer 220 between the hole injection layer 210 and the emitting material layer 230, an electron injection layer 250 between the second electrode 164 and the emitting material layer 230, and an electron transporting layer 240 between the electron injection layer 250 and the emitting material layer 230.

As described above, in the organic light emitting diode D of this embodiment, since the emitting material layer 230 includes the delayed fluorescent material, a quantum efficiency of the organic light emitting diode D and the organic light emitting display device (100 of FIG. 1) including the same can be improved. Therefore, the organic light emitting diode D and the organic light emitting display device 100 that have a high brightness without increase of driving voltage can be provided.

However, a light emitted from the organic light emitting diode D and the organic light emitting display device 100 of this embodiment is wide in full width at half maximum, and thus a color purity is reduced.

In other words, compared with an organic light emitting diode using a fluorescent material, the organic light emitting diode using the delayed fluorescent material has an advantage in quantum efficiency but has a disadvantage in color purity due to increase of a full width at half maximum.

Figure 5:
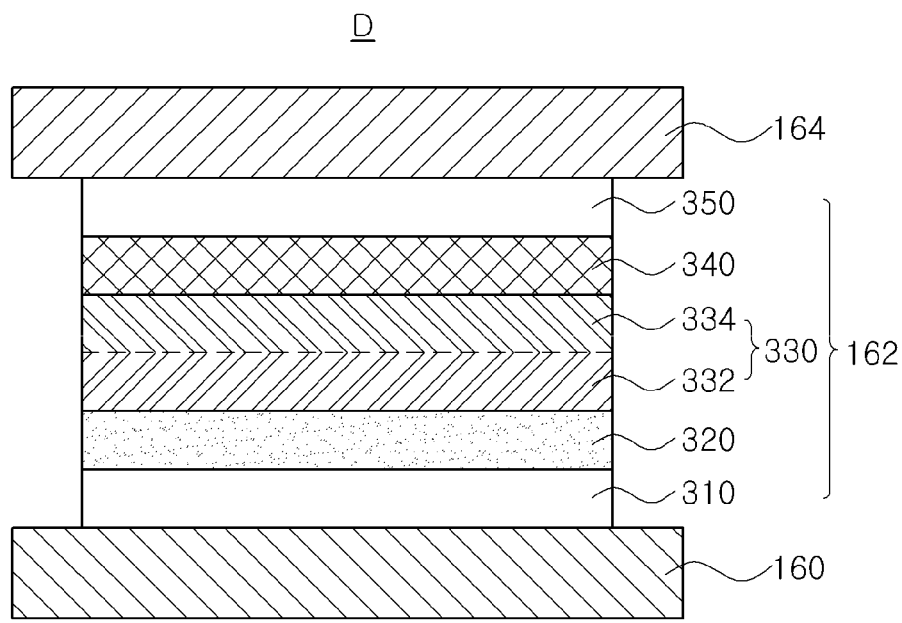
FIG. 5 is a schematic cross-sectional view illustrating an organic light emitting diode according to a second embodiment of the present invention.

FIG. 5 is a schematic cross-sectional view illustrating an organic light emitting diode according to a second embodiment of the present invention.

Referring to FIG. 5, the organic light emitting diode D of this embodiment includes first and second electrodes 160 and 164 facing each other, and an organic emitting layer 162 between the first and second electrodes 160 and 164. An emitting material layer 330 of the organic emitting layer 162 includes a first emitting material layer 332 and a second emitting material layer 334.

In this case, one of the first emitting material layer 332 and the second emitting material layer 334 includes a fluorescent material, and the other of the first emitting material layer 332 and the second emitting material layer 334 includes a delayed fluorescent material. For the purpose of explanations, a case that the first emitting material layer 332 includes the delayed fluorescent material, and the second emitting material layer 334 includes the fluorescent material is described.

Since a singlet energy and a triplet energy of the delayed fluorescent material is transferred to the fluorescent material and thus a light emission happens at the fluorescent material, the organic light emitting diode D increases in quantum efficiency and is reduced in full width at half maximum.

Figure 6:
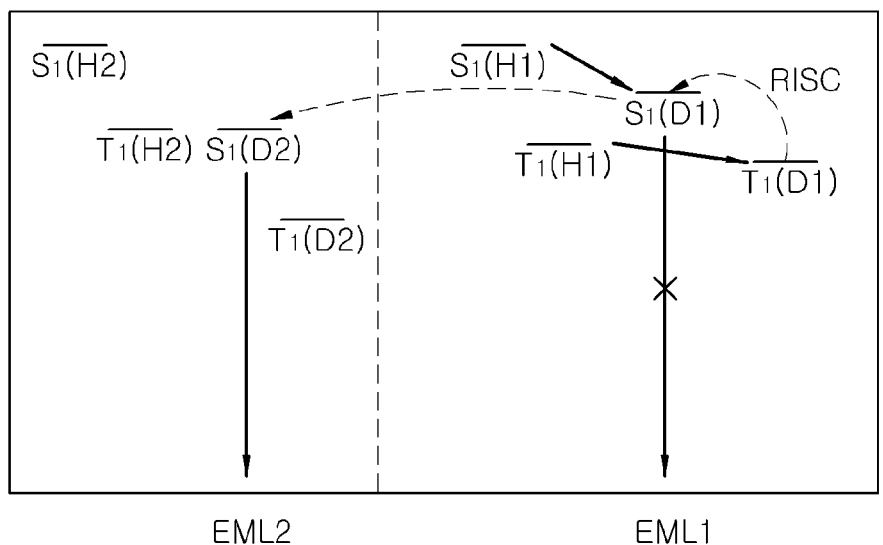
FIG. 6 is a view explaining a light emission mechanism in the organic light emitting diode according to the second embodiment of the present invention.

Referring to FIG. 6 that is a view explaining a light emission mechanism in the organic light emitting diode according to the second embodiment of the present invention, the singlet energy S1(D1) of the delayed fluorescent material of the first emitting material layer 332 (EML1) is transferred to the singlet energy S1(D2) of the second emitting material layer 334 (EML2) (i.e., Foster Resonance Energy Transfer), and thus a light emission at the fluorescent material happens. In other words, the singlet energy S1(D1) of the delayed fluorescent material is greater than the singlet energy S1(D2) of the fluorescent material (i.e., S1(D1)>S1 (D2)).

Since only the singlet energy of the fluorescent material is involved in light emission, the fluorescent material has a lower quantum efficiency than the delayed fluorescent material but has a narrower full width at half maximum than the delayed fluorescent material. Accordingly, the organic light emitting diode D, in which the singlet energy S1(D1) of the delayed fluorescent material is transferred to the singlet energy S1(D2) of the fluorescent material and thus a light emission happens at the fluorescent material, produces a light of a narrow full width at half maximum and has a high color purity.

In contrast, in case that the singlet energy S1(D1) of the delayed fluorescent material is less than or equal to the singlet energy S1(D2) of the fluorescent material, a light emission happens at the first emitting material layer 332 and thus a full width at half maximum of the organic light emitting diode D becomes wider. Further, since the second emitting material layer 334 does not play any role, a light emission efficiency of the organic light emitting diode D is reduced.

Figure 7:
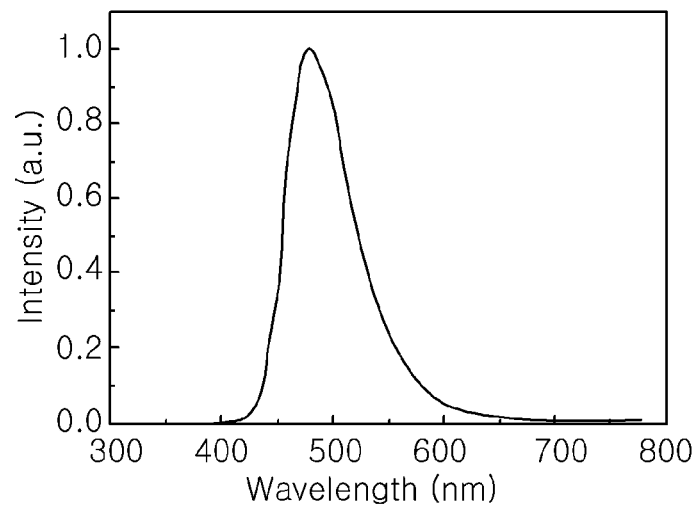
FIG. 7 is a graph illustrating a full width at half maximum in an organic light emitting diode including a single emitting material layer of a delayed fluorescent material.
Figure 8:
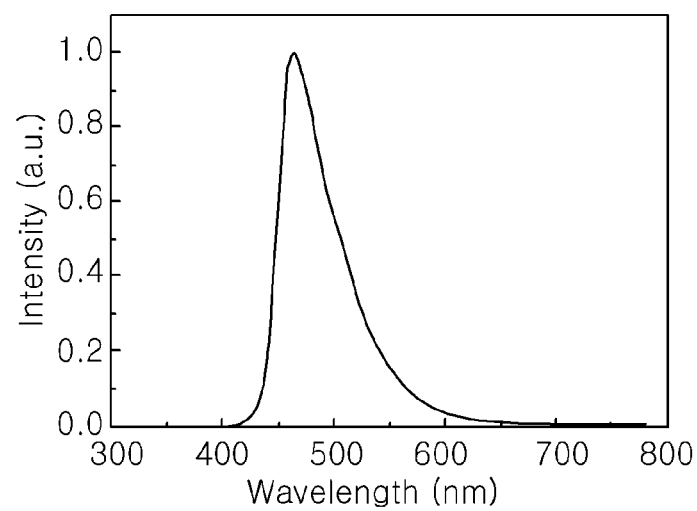
FIG. 8 is a graph illustrating a full width at half maximum in the organic light emitting diode of the second embodiment according to the present invention.

Referring to FIG. 7, which is a graph illustrating a full width at half maximum in an organic light emitting diode including a single emitting material layer of a delayed fluorescent material, and FIG. 8, which is a graph illustrating a full width at half maximum in the organic light emitting diode of this embodiment, it is seen that a full width at half maximum becomes narrower due to a light emission by the fluorescent material.

Further, in this embodiment, the triplet energy T1(D1) of the delayed fluorescent material is converted to the singlet energy S1(D1) of the delayed fluorescent material because of the reverse intersystem crossing effect at the delayed fluorescent material, and the singlet energy S1(D1) of the delayed fluorescent material is transferred to the singlet energy S1(D2) of the fluorescent material. In other words, the energy difference $\Delta E_{ST}$ between the triplet energy and the singlet energy in the delayed fluorescent material is less than 0.3 eV (i.e., $\Delta E_{ST}$<0.3 eV), and thus the reverse intersystem crossing phenomenon that the triplet energy T1(D1) of the delayed fluorescent material is converted to the singlet energy S1(D1) of the delayed fluorescent material happens.

Thus, the delayed fluorescent material functions to transfer an energy to the fluorescent material but the first emitting material layer 332 including the delayed fluorescent material is not involved in light emission, and a light emission happens at the second emitting material layer 334 including the fluorescent material.

In other words, since the triplet energy T1(D1) of the delayed fluorescent material is converted to the singlet energy S1(D1) of the delayed fluorescent material by the reverse intersystem crossing phenomenon, and the singlet energy S1(D1) of the delayed fluorescent material is transferred to the singlet energy S1(D2) of the fluorescent material by the singlet energy S1(D1) of the delayed fluorescent material greater than the singlet energy S1(D2) of the fluorescent material, the fluorescent material emits a light using both of the singlet energy and the triplet energy. Therefore, a quantum efficiency of the organic light emitting diode D can be improved.

In other words, the organic light emitting diode D and the organic light emitting display device 100 of this embodiment have advantages in both of quantum efficiency and full width at half maximum.

Further, the first and second emitting material layers 332 and 334 may use the delayed fluorescent material and the fluorescent material as respective dopants, and may further include a first host and a second host, respectively. The first host and the second host may be identical or different.

In this case, the first host of the first emitting material layer 332 may have a wt % greater than that of the delayed fluorescent material, and the second host of the second emitting material layer 334 may have a wt % greater than that of the fluorescent material. Further, a wt % of the delayed fluorescent material in the first emitting material layer 332 may be greater than that of the fluorescent material in the second emitting material layer 334. Accordingly, an energy transfer from the delayed fluorescent material to the fluorescent material can happen sufficiently.

A singlet energy S1(H1) of the first host is greater than the singlet energy S1(D1) of the delayed fluorescent material (i.e., a first dopant), and a triplet energy T1(H1) of the first host is greater than the triplet energy T1(D1) of the delayed fluorescent material (i.e., S1(H1)>S1(D1), and T1(H1)>T1 (D1)). Further, A singlet energy S1(H2) of the second host is greater than the singlet energy S1(D2) of the fluorescent material (i.e., a second dopant) (i.e., S1(H2)>S1(D2)).

When not satisfying this condition, a quenching happens at the first and second dopants or an energy transfer from the host to the dopant does not happen, and thus a quantum efficiency of the organic light emitting diode D is reduced.

Referring to FIG. 5, the organic emitting layer 162 of the organic light emitting diode D may further include a hole injection layer 310 between the first electrode 160 and the emitting material 330, a hole transporting layer 320 between the hole injection layer 310 and the emitting material layer 330, an electron injection layer 350 between the second electrode 164 and the emitting material layer 330, and an electron transporting layer 340 between the electron injection layer 350 and the emitting material layer 330.

As described above, in the organic light emitting diode D of this embodiment, since the emitting material layer 330 includes the first emitting material layer 332 including the delayed fluorescent material and the second emitting material layer 334 including the fluorescent material and the singlet energy S1(D1) of the delayed fluorescent material is greater than the singlet energy S1(D2) of the fluorescent material, a full width at half maximum of the organic light emitting diode D and the organic light emitting display device (100 of FIG. 1) including the same can be narrow.

Further, since the energy difference $\Delta E_{ST}$ between the triplet energy and the singlet energy in the delayed fluorescent material is less than 0.3 eV thus both of the triplet energy T1(D1) and the singlet energy S1(D1) of the delayed fluorescent material are transferred to the singlet energy S1(D2) of the fluorescent material and are used for a light emission, a quantum efficiency of the organic light emitting diode D and the organic light emitting display device 100 including the same can be improved.

Therefore, the organic light emitting diode D and the organic light emitting display device 100 that have a high brightness and a high color purity without increase of driving voltage can be provided.

Figure 9:
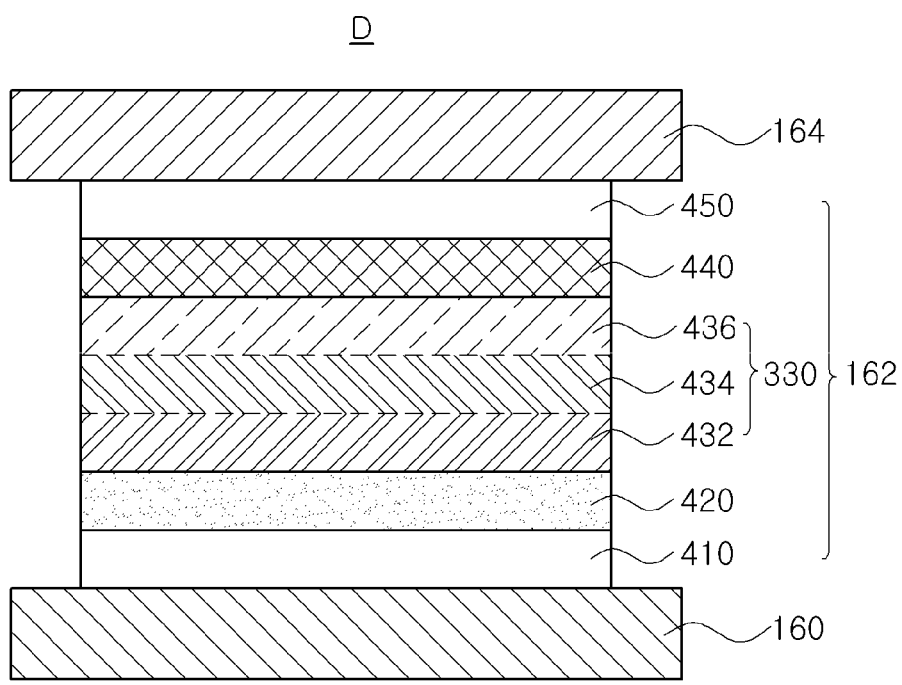
FIG. 9 is a schematic cross-sectional view illustrating an organic light emitting diode according to a third embodiment of the present invention.

FIG. 9 is a schematic cross-sectional view illustrating an organic light emitting diode according to a third embodiment of the present invention.

Referring to FIG. 9, the organic light emitting diode D of this embodiment includes first and second electrodes 160 and 164 facing each other, and an organic emitting layer 162 between the first and second electrodes 160 and 164. An emitting material layer 430 of the organic emitting layer 162 includes a first emitting material layer 432, a second emitting material layer 434, and a third emitting material layer 436.

The second emitting material layer 434 is between the first and third emitting material layers 432 and 436.

The second emitting material layer 434 includes one of a fluorescent material and a delayed fluorescent material, and the first and third emitting material layers 432 and 436 include the other of the fluorescent material and the delayed fluorescent material. For the purpose of explanations, a case that the second emitting material layer 434 includes the fluorescent material, and the first and third emitting material layers 432 and 436 include the fluorescent material is described.

Further, the first to third emitting material layers 432, 434 and 436 may use the delayed fluorescent material and the fluorescent material as respective dopants, and may further include first to third hosts, respectively. The first to third hosts may be identical or different.

In each of the first to third emitting material layers 432, 434 and 436, each of the first to third hosts may have a wt % greater than that of the corresponding one of the delayed fluorescent material and the fluorescent material. Further, the delayed fluorescent material of each of the first and third emitting material layers 432 and 436 may have a wt % greater than that of the fluorescent material of the second emitting material layer 434.

In this case, singlet energies of the first and third hosts are greater than singlet energies of the respective delayed fluorescent materials (i.e., first and third dopants), and triplet energies of the first and third hosts are greater than triplet energies of the respective delayed fluorescent materials. Further, a singlet energy of the second host is greater than a singlet energy of the fluorescent material (i.e., a second dopant).

In this organic light emitting diode D, since the singlet energy and the triplet energy of the delayed fluorescent material are transferred to the fluorescent material and a light emission happens at the fluorescent material, the organic light emitting diode D increases in quantum efficiency and is reduced in full width at half maximum.

As described above, since the singlet energy of the delayed fluorescent material is greater than the singlet energy of the fluorescent material, the singlet energy and the triplet energy of the delayed fluorescent material are transferred to the fluorescent material and thus a light emission happens as the fluorescent material. Therefore, a full width at half maximum of the organic light emitting diode D and the organic light emitting display device including the same (100 of FIG. 1) can be narrow.

In other words, an energy is transferred from the first and third emitting material layers 432 and 436 each including the delayed fluorescent material to the second emitting material layer 434 including the fluorescent material, a light emission happens at the second emitting material layer 434, and a full width at half maximum can be narrow due to the light emission of the fluorescent material.

Further, since the energy difference between the triplet energy and the singlet energy in the delayed fluorescent material is less than 0.3 eV thus both of the triplet energy and the singlet energy of the delayed fluorescent material are transferred to the singlet energy of the fluorescent material and are used for a light emission, a quantum efficiency of the organic light emitting diode D and the organic light emitting display device 100 including the same can be improved.

Further, in the organic light emitting diode D and the organic light emitting display device 100 including the same of this embodiment, by arranging the first and third emitting material layers 432 and 436, each including the delayed fluorescent material, at both sides of the second emitting material layer 434 including the fluorescent material, a efficiency of a foster resonance energy transfer from the singlet energy of the delayed fluorescent material having a radius less than 10 nm to the singlet energy of the fluorescent material is improved, and thus a quantum efficiency of the organic light emitting diode D and the organic light emitting display device 100 including the same can further increase. This increase of the quantum efficiency can similarly happen in a case that the second emitting material layer 434 includes the delayed fluorescent material and the first and third emitting material layers 432 and 436 each include the fluorescent material.

Therefore, the organic light emitting diode D and the organic light emitting display device 100 that have a high brightness and a high color purity without increase of driving voltage can be provided.

<Organic Light Emitting Diode>

An anode (ITO, 50 Å), a hole injection layer (chemical formula 1-1, 7 Å), a hole transporting layer (chemical formula 1-2, 55 Å), an electron blocking layer (chemical formula 1-3, 10 Å), an emitting material layer, a hole blocking layer (chemical formula 1-4, 10 Å), an electron transporting layer (chemical formula 1-5, 20 Å), an electron injection layer (LiF), and a cathode (Al) are stack to form an organic light emitting diode.

(1) Comparative Example

For an emitting material layer (25 Å), a compound (fluorescent dopant, 3 wt %) of a below chemical formula 1-6, and a compound (host, 97 wt %) of a below chemical formula 1-7 are used.

(2) Experimental Example 1

For an emitting material layer, a first emitting material layer (10 Å) including a compound (fluorescent dopant, 3 wt %) of a below chemical formula 1-6, and a compound (host, 97 wt %) of a below chemical formula 1-7, and a second emitting material layer (15 Å) including a compound (delayed fluorescent dopant, 30 wt %) of a below chemical formula 1-8, and a compound (host, 70 wt %) of a below chemical formula 1-7 are sequentially stacked.

(3) Experimental Example 2

For an emitting material layer, the second emitting material layer (10 Å), the first emitting material layer (5 Å), and the second emitting material layer of the first experimental example 1 (10 Å) are sequentially stacked.

[Chemical formula 1-1]
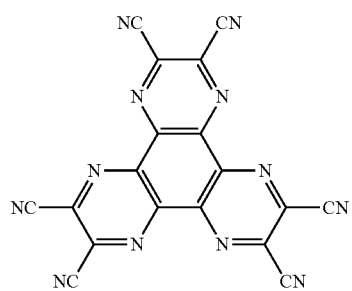
[Chemical formula 1-2]
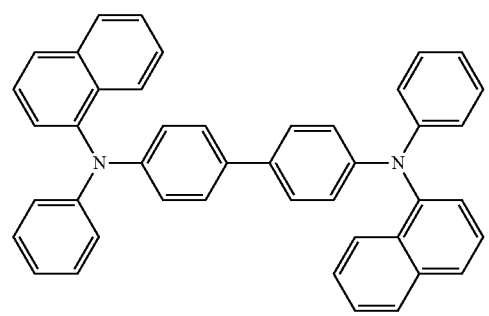
[Chemical formula 1-3]
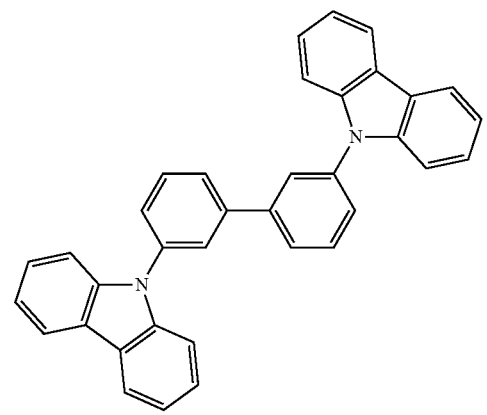
[Chemical formula 1-4]
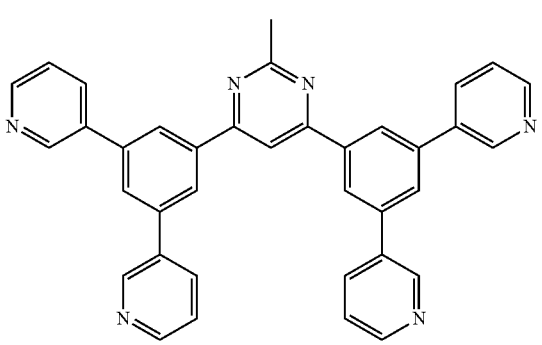
-continued
[Chemical formula 1-5]
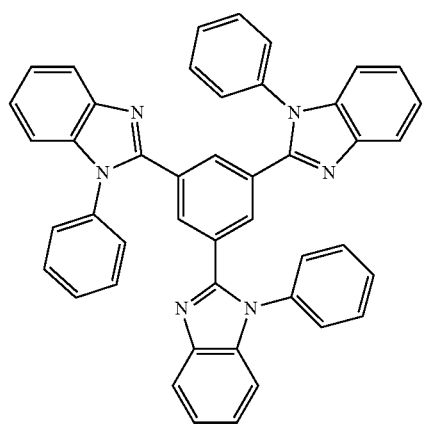
[Chemical formula 1-6]
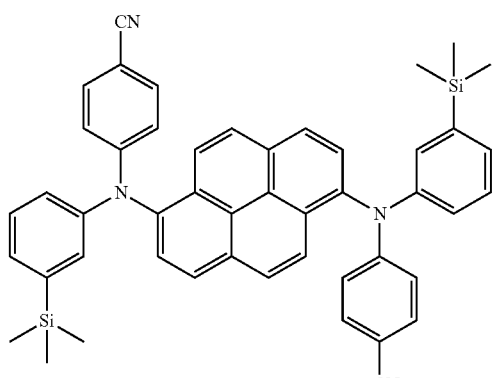
[Chemical formula 1-7]
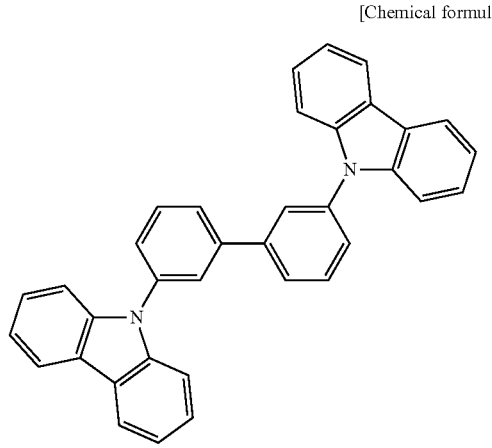
[Chemical formula 1-8]
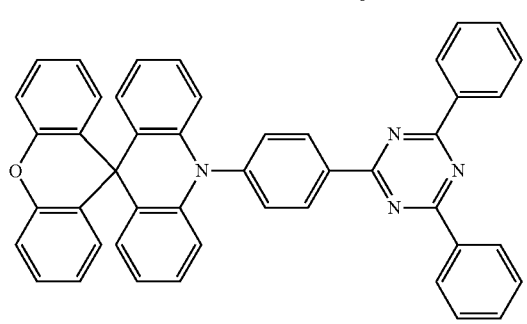

Figure 10:
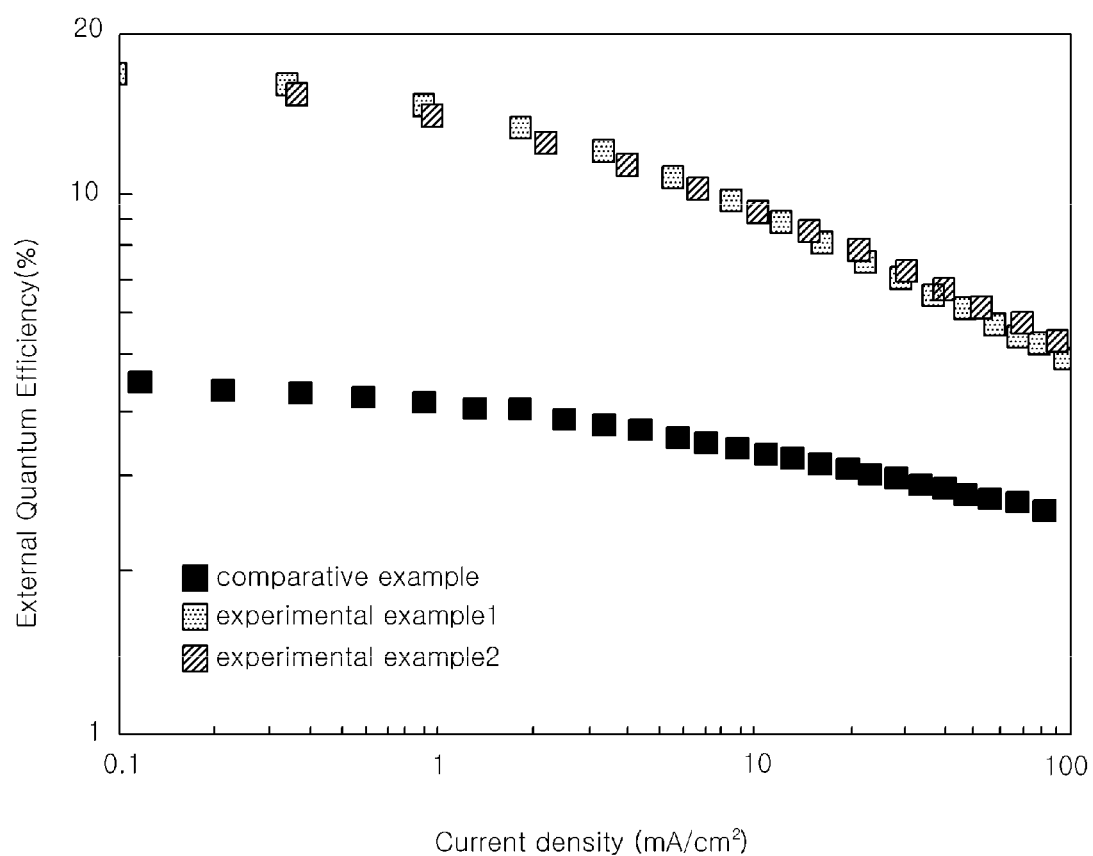
FIG. 10 is a graph illustrating external quantum efficiencies of organic light emitting diodes of a comparative example and experimental examples 1 and 2.

Luminous properties (maximum external quantum efficiency (EQE(max)), average external quantum efficiency (EQE(ave)), maximum luminous peak (λmax), and color coordinate) of organic light emitting diodes of the comparative example and the experimental examples 1 and 2 are written, and external quantum efficiencies of organic light emitting diodes of the comparative example and the experimental examples 1 and 2 are shown in FIG. 10 (measured at a condition of 10 mA/cm$^2$).

TABLE 1

|  | V | EQE (max) | EQE (ave) | λmax | CIE (x) | CIE (y) |
|---|---|---|---|---|---|---|
| Comparative example | 4.0 | 4.8 | 3.36 | 464 | 0.15 | 0.22 |
| Experimental example 1 | 3.8 | 16.1 | 9.2 | 463 | 0.15 | 0.21 |
| Experimental example 2 | 3.7 | 16.3 | 9.5 | 464 | 0.15 | 0.22 |

As shown in Table 1 and FIG. 10, compared with an organic light emitting diode (comparative example) only using a fluorescent material, organic light emitting diodes (experimental examples 1 and 2) of the present invention that includes emitting material layers configured with a delayed fluorescent material and a fluorescent material stacked at different layers have an improved luminous property.

Referring to color coordinates, in the organic light emitting diodes (experimental examples 1 and 2) of the present invention, it is seen that a light emission happen at the fluorescent material. In other words, the color coordinate of a light emitted from the organic light emitting diode of the present invention is substantially identical to that of a light emitted from the fluorescent material.

In the organic light emitting diode that includes the emitting material layers of the delayed fluorescent material located at both sides of the emitting material layer of the fluorescent material, a quantum efficiency is further improved.

Figure 11:
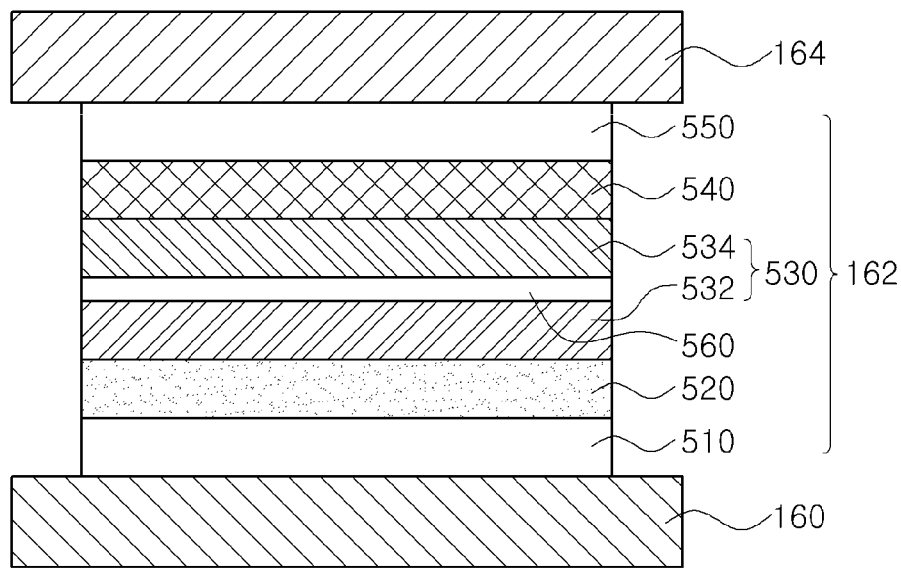
FIG. 11 is a schematic cross-sectional view illustrating an organic light emitting diode according to a fourth embodiment of the present invention.

FIG. 11 is a schematic cross-sectional view illustrating an organic light emitting diode according to a fourth embodiment of the present invention.

Referring to FIG. 11, the organic light emitting diode D of this embodiment includes first and second electrodes 160 and 164 facing each other, and an organic emitting layer 162 between the first and second electrodes 160 and 164. An emitting material layer 530 of the organic emitting layer 162 includes a first emitting material layer 532, a second emitting material layer 534, and an energy control layer between the first and second emitting material layers 560.

One of the first and second emitting material layers 532 and 534 includes a fluorescent material, and the other of the first and second emitting material layers 532 and 534 includes a delayed fluorescent material. For the purpose of explanations, a case that the first emitting material layer 532 includes the delayed fluorescent material, and the second emitting material layer 534 includes the fluorescent material is described.

Further, the first and second emitting material layers 532 and 534 may use the delayed fluorescent material and the fluorescent material as respective dopants, and may further include first and second hosts, respectively. The first and second hosts may be identical or different.

In the first and second emitting material layers 532 and 534, the first and second hosts may have a wt % greater than the delayed fluorescent material and the fluorescent material, respectively. Further, the delayed fluorescent material of the first emitting material layers 532 may have a wt % greater than that of the fluorescent material of the second emitting material layer 534.

In this case, a singlet energy of the first host is greater than a singlet energy of the delayed fluorescent material (i.e., a first dopant), and a triplet energy of the first host is greater than a triplet energy of the delayed fluorescent material. Further, a singlet energy of the second host is greater than a singlet energy of the fluorescent material (i.e., a second dopant).

In this organic light emitting diode D, since the singlet energy and the triplet energy of the delayed fluorescent material are transferred to the fluorescent material and a light emission happens at the fluorescent material, the organic light emitting diode D increases in quantum efficiency and is reduced in full width at half maximum.

As described above, since the singlet energy of the delayed fluorescent material is greater than the singlet energy of the fluorescent material, the singlet energy and the triplet energy of the delayed fluorescent material are transferred to the fluorescent material and thus a light emission happens as the fluorescent material. Therefore, a full width at half maximum of the organic light emitting diode D and the organic light emitting display device including the same (100 of FIG. 1) can be narrow.

In other words, an energy is transferred from the first emitting material layer 532 including the delayed fluorescent material to the second emitting material layer 534 including the fluorescent material, a light emission happens at the second emitting material layer 534, and a full width at half maximum can be narrow due to the light emission of the fluorescent material.

Further, since the energy difference between the triplet energy and the singlet energy in the delayed fluorescent material is less than 0.3 eV thus both of the triplet energy and the singlet energy of the delayed fluorescent material are transferred to the singlet energy of the fluorescent material and are used for a light emission, a quantum efficiency of the organic light emitting diode D and the organic light emitting display device 100 including the same can be improved.

Further, in the organic light emitting diode D and the organic light emitting display device 100 including the same of this embodiment, the energy control layer 560 that can block transferring from a triplet energy of the delayed fluorescent material to a triplet energy of the fluorescent material is located between the first and second emitting material layers 532 and 534.

Figure 12:
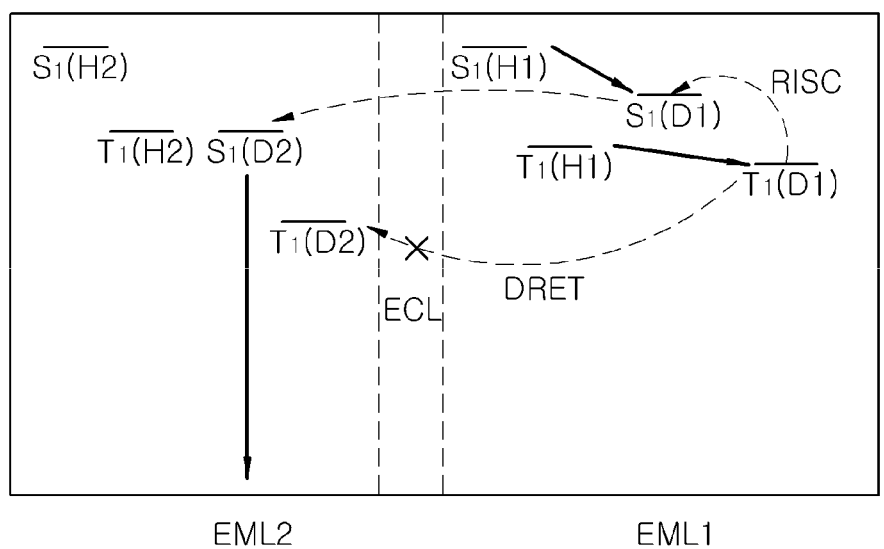
FIG. 12 is a view explaining a light emission mechanism in the organic light emitting diode according to the fourth embodiment of the present invention.

Referring to FIG. 12 that is a view explaining a light emission mechanism in the organic light emitting diode according to the fourth embodiment of the present invention, the singlet energy S1(D1) of the delayed fluorescent material of the first emitting material layer 532 (EML1) is transferred to the singlet energy S1(D2) of the second emitting material layer 534 (EML2) (i.e., Foster Resonance Energy Transfer), and thus a light emission at the fluorescent material happens. In other words, the singlet energy S1(D1) of the delayed fluorescent material is greater than the singlet energy S1(D2) of the fluorescent material (i.e., S1(D1)>S1(D2)).

Accordingly, the organic light emitting diode D, in which the singlet energy S1(D1) of the delayed fluorescent material is transferred to the singlet energy S1(D2) of the fluorescent material and thus a light emission happens at the fluorescent material, produces a light of a narrow full width at half maximum and has a high color purity.

Further, the triplet energy T1(D1) of the delayed fluorescent material is converted to the singlet energy S1(D1) of the delayed fluorescent material because of the reverse intersystem crossing effect at the delayed fluorescent material, and the singlet energy S1(D1) of the delayed fluorescent material is transferred to the singlet energy S1(D2) of the fluorescent material. In other words, the energy difference $\Delta E_{ST}$ between the triplet energy and the singlet energy in the delayed fluorescent material is less than 0.3 eV (i.e., $\Delta E_{ST}$<0.3 eV), and thus the reverse intersystem crossing phenomenon that the triplet energy T1(D1) of the delayed fluorescent material is converted to the singlet energy S1(D1) of the delayed fluorescent material happens. Accordingly, both of the singlet energy and the triplet energy of the delayed fluorescent material are transferred to the fluorescent material, and thus a quantum efficiency of the fluorescent material increases.

The triplet energy of the delayed fluorescent material may not be converted to the singlet energy of the delayed fluorescent material but may be transferred to the triplet energy of the fluorescent material (i.e., a Dexter Resonance Energy Transfer). In this case, since the triplet energy of the fluorescent material is not involved in light emission, a quantum efficiency of the organic light emitting diode D is reduced.

However, in this embodiment, the energy control layer 560 (ECL), which is made of a material having a triplet energy greater than the triplet energy of the delayed fluorescent material, is located between the first and second emitting material layers 532 and 534, and thus a transfer from the triplet energy of the delayed fluorescent material to the triplet energy of the fluorescent material can be prevented.

In a case that the emitting material layer 430 includes the first to third emitting material layers 432, 434 and 436, as shown in FIG. 9, the energy control layer 560 may be located between the first and second emitting material layers 432 and 434 and located between the second and third emitting material layers 434 and 436.

The energy control layer 560 may be made of an energy control compound expressed by a below chemical formula 2.

[Chemical formula 2]

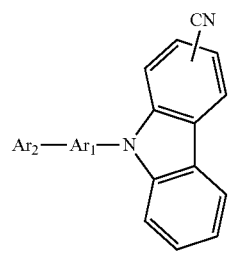

In the chemical formula 2, $Ar_1$ may be a C6~C30 aryl or heteroaryl, and $Ar_2$ may be a carbazole or bicarbazole.

For example, the energy control compound may be one of compounds in a below chemical formula 3.

[Chemical formula 3]

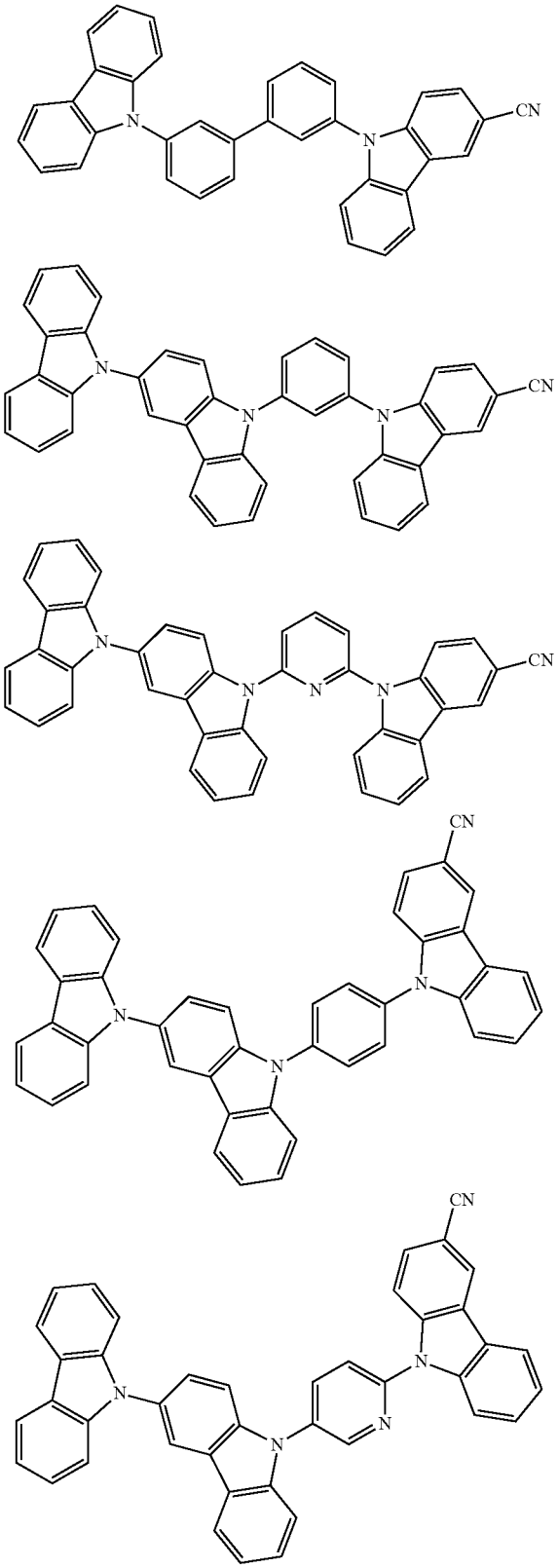

Accordingly, in the organic light emitting diode D further including the energy control layer 560 between the first and second emitting material layers 532 and 534, since the triplet energy of the delayed fluorescent material is transferred to the singlet energy of the fluorescent material through the singlet energy of the delayed fluorescent material and is used for a light emission, a quantum efficiency of the organic light emitting diode D can be further improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode, comprising:
   an emitting material layer including first and second layers;
   a first electrode on a side of the emitting material layer; and
   a second electrode on the other side of the light emitting material layer and facing the first electrode,
   wherein the first layer includes a first compound, and the second layer includes a second compound, wherein the first compound is of Formula 1-8 and the second compound is of Formula 1-6

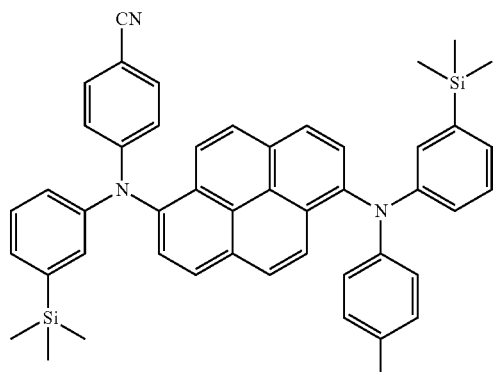

Formula 1-6

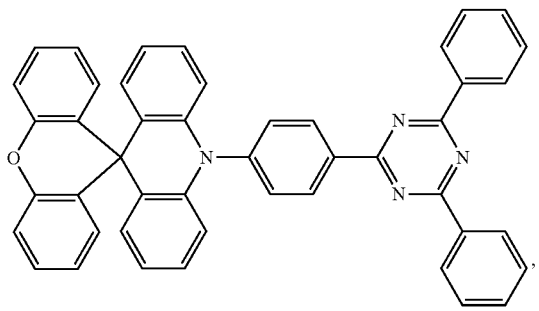

Formula 1-8 wherein the first compound has a difference, between a singlet energy and a triplet energy, less than 0.3 eV, and wherein the singlet energy of the first compound is greater than a singlet energy of the second compound.

2. The organic light emitting diode of claim 1, wherein the first layer further includes a third compound, the second layer further includes a fourth compound, where the third compound and the fourth compound are of Formula 1-7

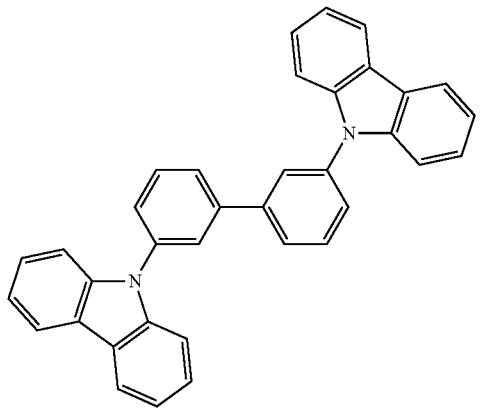

Formula 1-7 wherein a singlet energy and a triplet energy of the third compound are greater than the singlet energy and the triplet energy of the first compound, respectively, and
wherein a singlet energy of the fourth compound is greater than the singlet energy of the second compound.

3. The organic light emitting diode of claim 2, wherein the third compound has a wt % greater than the first compound, and the fourth compound has a wt % greater than the second compound.

4. The organic light emitting diode of claim 2, wherein the wt % of the first compound in the first layer is greater that of the second compound in the second layer.

5. The organic light emitting diode of claim 1, further comprising an energy control layer between the first and second layers, wherein a triplet energy of the energy control layer is greater than the triplet energy of the first compound.

6. The organic light emitting diode of claim 5, wherein the energy control layer includes a material of the chemical formula

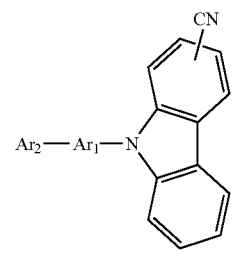

wherein
Ar$_1$ is a C$_5$ to C$_{30}$ aryl or heteroaryl, and
Ar$_2$ is a carbazole or bicarbazole.

7. The organic light emitting diode of claim 1, wherein the emitting material layer further includes a third layer which faces the first layer with the second layer therebetween,
wherein a third compound of the third layer is of the Formula 1-8

Formula 1-8

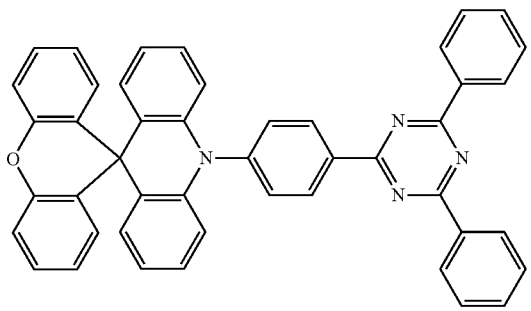

Formula 1-6

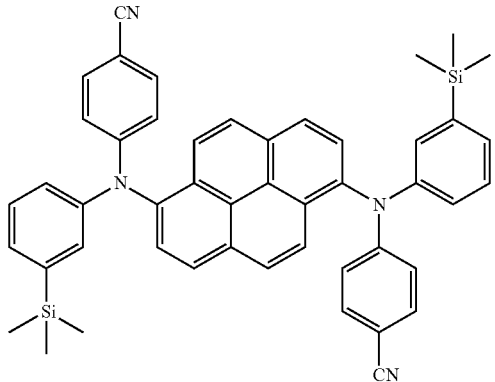

and has a difference, between a singlet energy and a triplet energy, of less than 0.3 eV, wherein the singlet energy of the third compound is greater than the singlet energy of the second compound.

8. The organic light emitting diode of claim 1, wherein the emitting material layer further includes a third layer which faces the second layer with the first layer therebetween, wherein a third compound of the third layer is of the Formula 1-6 and has a singlet energy less than the singlet energy of the first compound.

9. The organic light emitting diode of claim 1, wherein a color coordinate of a light emitted from the emitting material layer is substantially identical to a color coordinate of a light emitted from the second compound.

10. An organic light emitting display device, comprising:
a substrate;
a thin film transistor on the substrate; and
the organic light emitting diode, of claim 1, connected to the thin film transistor.

* * * * *